United States Patent
Ciccarelli

[11] Patent Number: 6,075,237
[45] Date of Patent: Jun. 13, 2000

[54] IMAGE SENSOR COVER WITH INTEGRAL LIGHT SHIELD

[75] Inventor: Antonio S. Ciccarelli, Rochester, N.Y.

[73] Assignee: Eastman Kodak Company, Rochester, N.Y.

[21] Appl. No.: 09/124,666

[22] Filed: Jul. 29, 1998

[51] Int. Cl.[7] .................. H01J 40/14; H01L 31/0232
[52] U.S. Cl. .................. 250/208.1; 250/237 R; 250/239; 257/434; 257/435
[58] Field of Search ............. 250/208.1, 237 R, 250/216, 239; 257/435, 434, 433, 432, 431, 437; 358/482, 483, 499

[56] References Cited

U.S. PATENT DOCUMENTS

| 5,302,818 | 4/1994 | Pezant | 257/434 |
| 5,534,725 | 7/1996 | Hur | 257/434 |
| 5,550,398 | 8/1996 | Kocian et al. | 257/434 |
| 5,767,508 | 6/1998 | Masui et al. | 257/435 |
| 5,945,721 | 8/1999 | Tatch | 257/434 |

FOREIGN PATENT DOCUMENTS

| 2-94474 | 4/1990 | Japan | 257/434 |
| 4-44265 | 2/1992 | Japan | 257/434 |

*Primary Examiner*—John R. Lee
*Attorney, Agent, or Firm*—James D. Leimbach

[57] ABSTRACT

An image sensor package cover with an opaque epoxy silk-screened into it. This epoxy is patterned to the appropriate size, for a particular sensor, to form an integral light shield on the cover, while simultaneously covering to the package. This masks the internal light reflections as well as the prior art methods of using a separate light shield, but eliminates a separate component and the costly labor required to assemble such a product. Such a configuration can be applied to a linear or area type image sensor.

8 Claims, 2 Drawing Sheets

IMAGE SENSOR COVER WITH INTEGRAL LIGHT SHIELD

FIELD OF THE INVENTION

This invention relates to the field of solid state image sensors, and more specifically, to the components used to package the sensors.

BACKGROUND OF THE INVENTION

Solid State Image Sensors within the prior art typically are placed within a package having a glass or plastic cover on the package to allow incident light to strike the surface of the imager. The cover is typically sealed to the sensor package using an epoxy that has been either silk-screened or dispensed onto the cover. A more common technique is to place a thin line of epoxy beads around the outer edge of a sensor package as seen in FIG. 1 to attach the cover glass. There is a basic problem in the arrangement shown in FIG. 1. The inside surface of the cover glass allows light entering the package cavity to be reflected from the surfaces inside the package cavity, such as bond wires, lead frame, etc., and back to the inside surface of the cover. These reflections can subsequently be directed back to the imager causing undesired information to be sensed as part of the incident image.

These undesired reflections have been successfully reduced by the use of a separate light shield, typically of some blackened metallic material, mounted into the package cavity, above the imager and below the cover, prior to sealing the cover onto the package, as shown in FIG. 2. The aperture opening in this light shield is typically slightly larger than the imager active region so as not to impede the incoming light over the sensor, but successfully masks internal light reflections. The disadvantage to this configuration is the additional labor cost associated with the addition of the separate light shield containing the aperture, as well as the cost of the additional component.

From the foregoing discussion, it should be apparent that there remains a need in the art for a more economically advantageous manner of placing light shields on image sensing elements.

SUMMARY OF THE INVENTION

The present invention addresses the foregoing discussed problems in the prior art by providing a package cover with an opaque epoxy silk-screened into it. This epoxy is patterned to the appropriate size, for a particular sensor, to form an integral light shield on the cover, while simultaneously providing the means to seal the cover to the package, refer to FIGS. 3 and 4. This method of masking the internal light reflections functions as well as the prior art methods of using separate light shield, but eliminates a separate component and the costly labor required to assemble such a product. Such a configuration can be applied to a linear or area type image sensor.

DETAILED DESCRIPTION OF THE INVENTION

Figure 1:
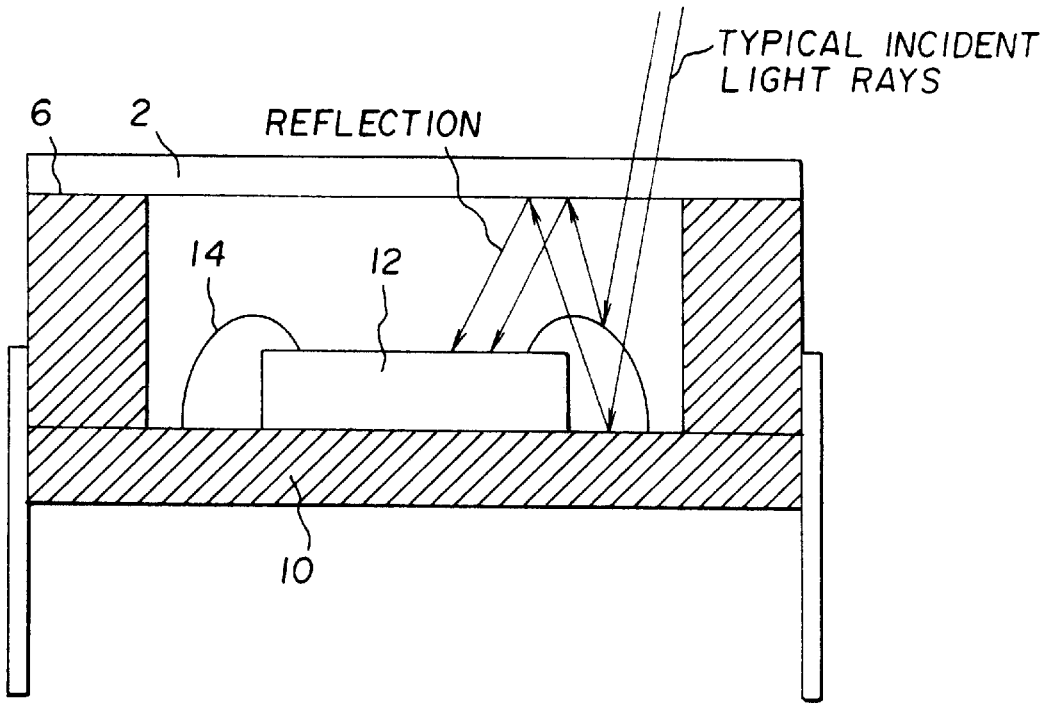
FIG. 1 is a prior art cross-sectional view of an imager assembly.
Figure 2:
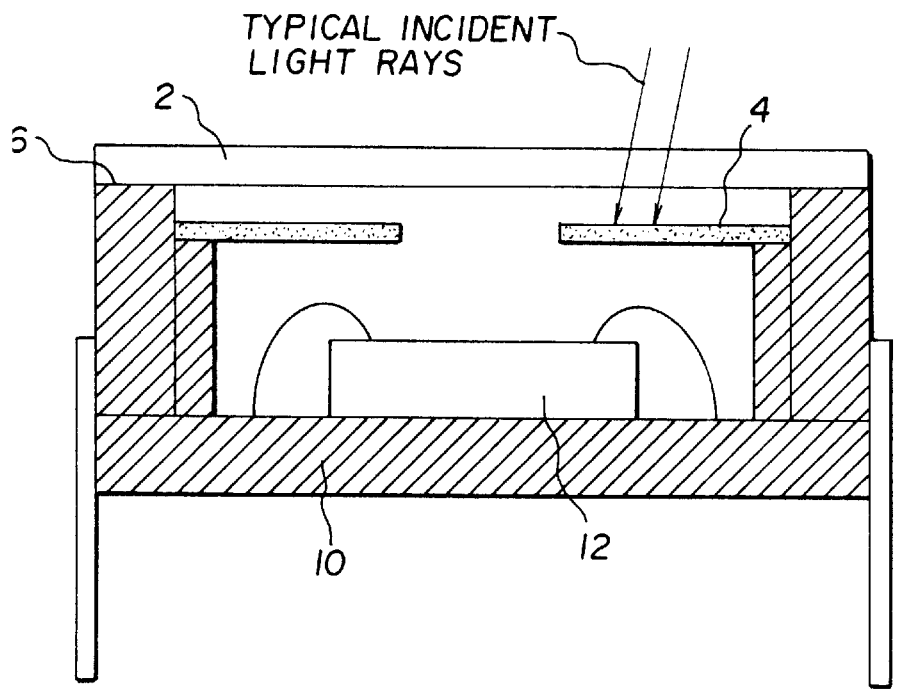
FIG. 2 is a prior art cross-sectional view of an imager assembly with a separate light shield.
Figure 3:
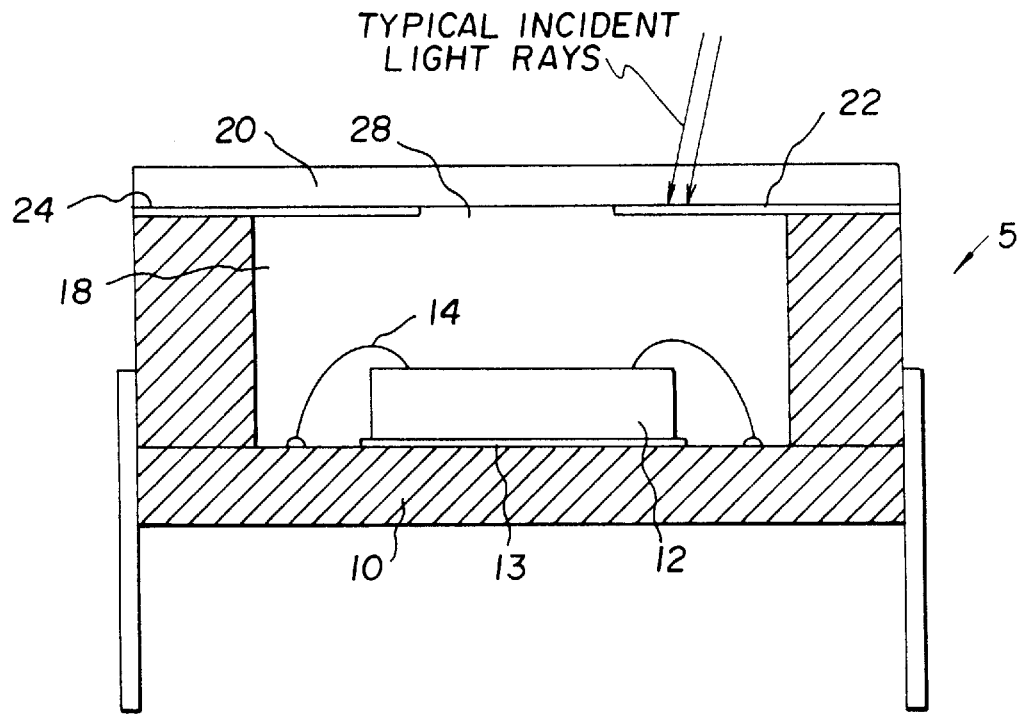
FIG. 3 is an imager cover with integral light shield.
Figures 4A, 4B:
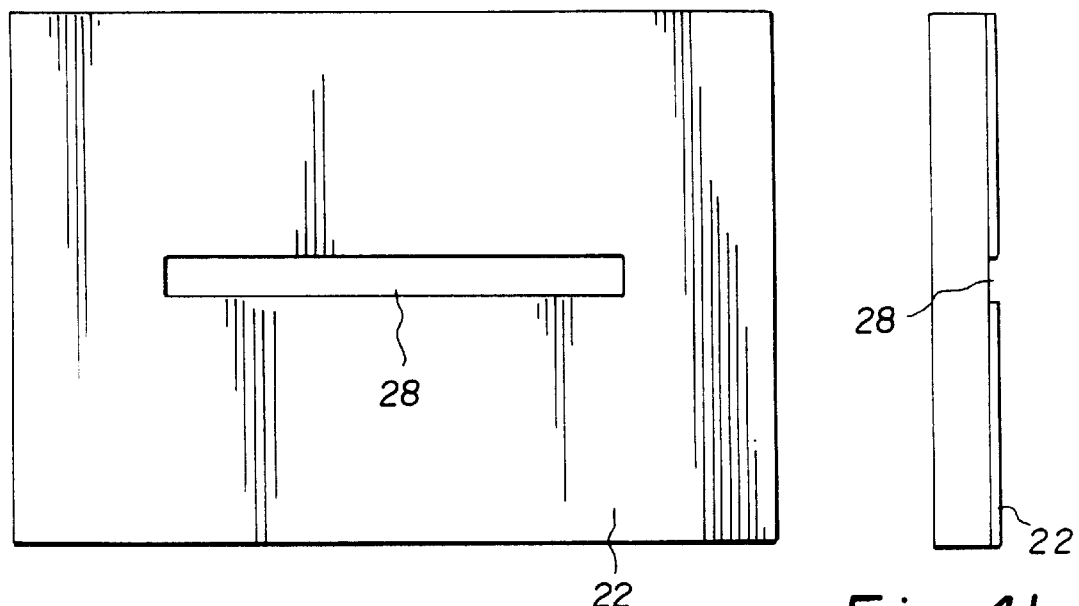
FIG. 4a is a top view of the invention.
FIG. 4b is a side view of the invention of an imager assembly with integral light shield.

It has been discovered, that substantial cost savings can be achieved in image sensor packaging, by providing a package cover integrated with a light shield. Referring to FIG. 3 in conjunction with FIG. 4, the present invention takes an image sensing package 10 as used in the prior art and places the image sensor 12 onto conductive pads 13 within cavity 18 of package 10. Cover glass 20 is placed upon package 10. The present invention provides light shield 22 upon cover glass 20. Preferably, an opaque epoxy is silk-screened onto the cover glass 20 to form light shield 22. The silk screen has aperture 28 within the pattern used to form light shield 22. The epoxy (or any opaque material such as paint, glue, or a thin film deposition such as a metal or an oxide) is used to fashion light shield 22 is patterned to the appropriate size, which is predetermined for a particular sensor, to form an integral light shield 22 on cover glass 20.

It is specifically envisioned that the epoxy that is used for forming light shield 22 can simultaneously provide the seal 24 between cover glass 20 and package 10. In this manner a single step of patterning the epoxy for light shield 22 can also create aperture 28 and seal 24 to the entire sensor assembly 5. Once assembled, this method of masking the internal light reflections functions as well as the prior art methods of using separate light shield, but eliminates a separate component and the costly labor required to assemble such a product. Such a configuration can be applied to a linear or area type image sensor.

The foregoing discussion has illustrated the embodiment most preferred to the inventors. Obvious modifications will be readily apparent to those skilled in the relevant arts. Accordingly, the scope of the present invention should be measured by the appended claims.

What is claimed is:

1. An assembly for an image sensor comprising:

an image sensor package having an internal cavity;

an image sensor contained within the internal cavity that is electrically coupled to a plurality of connector pads within the internal cavity;

a plurality of photodetectors contained on the image sensor; and a transparent cover for the image sensor package, the cover having an integrated light shield formed from an opaque material silk-screened on the cover such that there is an aperture within the light shield over at least the photodetectors.

2. The invention of claim 1 wherein the opaque material silk-screened onto the cover is selected from one of the following: epoxy; paints; glues; metal; or oxides.

3. The invention of claim 1 wherein the opaque material is epoxy which is patterned to form an integral light shield on the cover, while simultaneously providing means for sealing the cover to the package.

4. The invention of claim 1 wherein the sensor further comprises a linear sensor.

5. A method of masking the internal light reflections within an image sensor assembly comprising the steps of:

providing an image sensor package having an internal cavity containing an image sensor that is electrically coupled to a plurality of connector pads within the internal cavity; and integrating a light shield on a transparent cover by silk-screening an opaque material onto the cover such that there is an aperture in the light shield; and placing the transparent cover over the image sensor package such that the aperture is at least over the image sensor.

6. The method of claim 5 wherein the step of integrating further comprises forming the opaque material from one of the following: epoxy; paints; glues; metal; or oxides.

7. The method of claim 6 wherein the step of integrating further comprises forming the opaque material such that it is patterned to a predetermined size to form an integral light shield on the cover; and simultaneously forming sealing means for attaching the cover to the package.

8. The method of claim 5 wherein the step of providing further comprises providing a linear sensor.

* * * * *